United States Patent [19]

Lever et al.

[11] 4,222,792
[45] Sep. 16, 1980

[54] PLANAR DEEP OXIDE ISOLATION PROCESS UTILIZING RESIN GLASS AND E-BEAM EXPOSURE

[75] Inventors: Reginald F. Lever, Putnam Valley, N.Y.; John L. Mauer, IV, Sherman, Conn.; Alwin E. Michel, Ossining, N.Y.; Laura B. Rothman, Sherman, Conn.

[73] Assignee: International Business Machines Corporation, N.Y.

[21] Appl. No.: 73,593

[22] Filed: Sep. 10, 1979

[51] Int. Cl.$^2$ .................. H01L 21/26; H01L 21/316; H01L 21/76
[52] U.S. Cl. .............................. 148/1.5; 29/576 W; 29/578; 29/580; 106/287.13; 148/175; 156/643; 156/657; 156/662; 357/49; 357/50; 357/54; 427/93; 427/95; 427/43.1
[58] Field of Search .................. 148/1.5, 174, 175; 156/643, 644, 657, 662; 29/576 W, 578, 580; 427/93, 95, 43; 357/49, 50, 54; 106/287.13

[56] References Cited

U.S. PATENT DOCUMENTS

| | | | |
|---|---|---|---|
| 3,575,740 | 4/1971 | Castrucci et al. | 148/175 |
| 3,832,202 | 8/1974 | Ritchie | 106/287.13 |
| 3,834,939 | 9/1974 | Beyer et al. | 148/188 |
| 3,892,608 | 7/1975 | Kuhn | 148/175 X |
| 3,966,577 | 6/1976 | Hochberg | 156/643 X |
| 3,985,597 | 10/1976 | Zielinski | 427/90 X |
| 3,998,673 | 12/1976 | Chow | 148/175 |
| 4,004,044 | 1/1977 | Franco et al. | 427/43.1 |
| 4,075,044 | 2/1978 | Jager et al. | 427/93 X |
| 4,104,086 | 8/1978 | Bondur et al. | 148/1.5 |
| 4,139,442 | 2/1979 | Bondur et al. | 357/50 X |

OTHER PUBLICATIONS

Klerer, J., "Method for Deposition of SiO$_2$ at Low Temperatures," J. Electrochem. Soc., vol. 108, No. 11, Nov. 1961, pp. 1070-1071.
Berkenblit et al., "Low Temperature Forming of SiO$_2$ Layers," I.B.M. Tech. Discl. Bull., vol. 13, No. 5, Oct. 1970, p. 1297.
Roberts, E. D., "Preparation and Properties of Polysiloxane Electron Resist," J. Electrochem. Soc., vol. 120, No. 12, Dec. 1973, pp. 1716-1721.

Primary Examiner—L. Dewayne Rutledge
Assistant Examiner—W. G. Saba
Attorney, Agent, or Firm—Wesley DeBruin

[57] ABSTRACT

A planar deep oxide isolation process for providing deep wide silicon dioxide filled trenches in the planar surface of a silicon semiconductor substrate, said process comprising the steps:

(a) forming deep wide trenches in the planar surface of the silicon substrate;
(b) forming a thin layer of silicon dioxide on the planar surface of the silicon substrate and the exposed silicon surfaces of said deep wide trenches;
(c) applying resin glass (polysiloxane) to the planar surface of said semiconductor substrate and within said deep wide trenches;
(d) spinning off at least a portion of the resin glass on the planar surface of the substrate;
(e) baking the substrate at a low temperature;
(f) exposing the resin glass contained within the deep wide trenches of substrate to the energy of an E-beam;
(g) developing the resin glass contained on said substrate in a solvent;
(h) heating said substrate in oxygen to convert said resin glass contained within said deep wide trenches to silicon dioxide;
(i) depositing a layer of silicon dioxide to provide a planar silicon dioxide surface on the exposed the surface of said substrate; and
(j) planarize exposed silicon dioxide surface to silicon of substrate.

A planar deep oxide isolation process for providing deep wide silicon dioxide filled trenches in the planar surface of a silicon semiconductor substrate as recited in the preceding paragraph, wherein the following steps are performed in lieu of step i of claim 1, said steps comprising:

(i-1) apply a second thin layer of resin glass; and
(i-2) convert said resin glass to silicon dioxide.

7 Claims, 5 Drawing Figures

PLANAR DEEP OXIDE ISOLATION PROCESS UTILIZING RESIN GLASS AND E-BEAM EXPOSURE

BACKGROUND OF THE INVENTION AND PRIOR ART

Recessed dielectric isolation and, in particular, recessed silicon dioxide isolation are known in the large scale integrated semiconductor art for providing electrically isolated pockets on the same silicon chip, for separating base and collector contact regions of transistors constructed within isolated pockets, and for insulating conductors from the underlying silicon substrate. It is also known that recessed dielectric isolation can be produced by first selectively removing silicon from a substrate and then filling the trenches with dielectric material such as, for example, in the manner described in U.S. Pat. No. 3,966,577 issued on June 29, 1976 to A. K. Hochberg for "Dielectrically Isolated Semiconductor Devices".

In the interest of minimizing the silicon chip area occupied by the dielectrically filled trenches, sputter etching processes and reactive ion etching processes have been utilized to form the trenches in the silicon substrate. A reactive ion etching process is described in copending application Ser. No. 594,418, filed July 9, 1975, now abandoned in the name of J. M. Harvilchuck et al for "Reactive Ion Etching of Silicon" and assigned to the present assignee, to provide trenches having vertical sidewalls without significant mask undercutting and the tapered walls which are characteristic of chemical etching processes.

Reference is made to U.S. Pat. No. 4,104,086 entitled "Method for Forming Isolated Regions of Silicon Utilizing Reactive Ion Etch" granted Aug. 1, 1978 to J. A. Bondur et al and of common assignee with the subject application. The Bondur et al patent discloses a method for achieving well-filled deep narrow grooves with near vertical walls. The method consists of the formation of slightly tapered narrow grooves cut through buried highly doped Si regions, thermal oxidation of said grooves and proper filling in of the remaining grooves with a vapor deposited dielectric material. The application points out the need for forming slightly tapered walls and discusses the dependency of the quality and planarity of the dielectric filling material on the groove taper angle and groove width, respectively. The method also consists of a back etching of the filling material which covers the total wafer, with reactive ion etching to remove the material everywhere from the surface to leave only the isolation pockets.

Reference is made to U.S. Pat. No. 4,139,442 entitled "Reactive Ion Etching Method for Producing Deep Dielectric Isolation in Silicon" granted Feb. 13, 1979 and of common assignee with the subject application. The Bondur et al patent discloses a method for producing deeply recessed oxidized regions in silicon. A series of deep trenches are formed in a silicon wafer by a reactive ion etching (RIE) method. In a first species, the trenches are of equal width. A block-off mask is selectively employed during part of the RIE process to produce trenches of unequal depth. The trench walls are thermally oxidized to completely fill in all of the trenches with oxide at the same time. In a second species, the trenches are of equal depth and width and of uniform spacing. In one aspect of the second species, the width of the trenches is equal to the distance between the trenches whereby the thermal oxidation completely fills in the trenches with oxide at the same time that the silicon between the trenches is fully converted to silicon oxide. In another aspect of the second species, the trenches are wider than the distance between the trenches whereby the thermal oxidation only partially fills in the trenches with oxide when the intervening silicon is fully converted to silicon oxide. In the latter aspect, the filling of the trenches is completed by the deposition of suitable material such as pyrolytically deposited silicon oxide.

Numerous techniques, methods and approaches to provide dielectric isolation in integrated circuit structures are known to the art. A representative number of which are identified and briefly discussed below.

Reference is made to U.S. Pat. No. 3,442,011 entitled "Method for Isolating Individual Devices In An Integrated Circuit Monolithic Bar" granted May 6, 1969 to F. J. Strieter. The Strieter patent discloses selective conversion of portions of a semiconductor wafer from semiconducting to insulating, leaving unconverted "pockets" of single-crystal semiconducting material isolated from each other by the insulating portions. The conversion is achieved by masking the portions of the semiconductor wafer which are to remain semiconducting, and thereafter chemically reacting the unmasked portions with oxygen, as one example, to form a new species of material (in the case of oxygen the new species would be silicon oxide) which is insulating. The pockets of unconverted semiconductor material serve as regions into which subsequent diffusions may be made or epitaxial depositions carried out in order to form diode or transistor structures, for example, of an integrated circuit, which are joined by a common substrate and yet are electrically isolated through the substrate by the insulating portions.

Reference is made to U.S. Pat. No. 3,575,740 entitled "Method of Fabricating Planar Dielectric Isolated Integrated Circuits" granted Apr. 20, 1971 to P. P. Castrucci et al. The method disclosed in the Castrucci et al patent includes etching isolation channels in a semiconductor substrate through a suitable mask. The mask pattern is designed to enhance deeper etching at certain locations in the isolation channels. A dielectric layer is formed over the exposed surfaces of the isolation channels and a semiconductor material is grown in the channels. The deeper etched locations which are now filled with dielectric isolation are used as a depth guide in the formation of a dielectric layer from the semiconductor substrate surface opposite to the one from which the etching took place. The depth guide can be used in either a deep etch or lap-back process. The last isolation step is then to continue the dielectric layer past the depth guide to the major portion of the isolation channels to produce the fully isolated islands of semiconductor material in the semiconductor substrate.

Reference is made to U.S. Pat. No. 3,648,125 entitled "Method of Fabricating Integrated Circuits with Oxidized Isolation and the Resulting Structure" granted Mar. 7, 1972 to D. L. Peltzer. The Peltzer patent discloses a thin silicon epitaxial layer, formed on a silicon substrate, subdivided into electrically isolated pockets by a grid of oxidized regions of epitaxial silicon material which extend through the epitaxial layer to a laterally extending PN junction.

Reference is made to U.S. Pat. No. 3,698,966 entitled "Process Using A Masking Layer For Producing Field Effect Device Having Oxide Isolation" granted Oct. 17, 1972 to R. E. Harris. In the Harris patent oxide films and a nitride layer are selectively formed over the surface of a semiconductor wafer to define areas of the wafer in which field effect devices are to be formed. The nitride layer masks the inner oxide film as an oxide layer is formed around the masked regions to form laterally isolated semiconductor islands in which the field effect devices are to be formed. Part of the nitride layer is then used to mask the oxide film defining the gate region of the field effect device. Conductivity regions are formed in the island by diffusion as nitride layers mask the contact regions of the field effect devices. Contacts are formed on the contact regions.

Reference is made to U.S. Pat. No. 3,796,613 entitled "Method of Forming Dielectric Isolation for High Density Pedestal Semiconductor Devices" granted Mar. 12, 1974 to I. E. Magdo et al. The Magdo et al patent discloses forming dielectrically isolated pedestal semiconductor devices which are particularly adapted to form a part of an integrated circuit. The structure is useable for integrated circuits, including field effect and/or bipolar transistors wherein a significant savings in surface area and reduction in capacitance can be obtained over prior technique. The method involves forming a layer of dielectric material upon a semiconductor body, having a diffused region where a bipolar device is to be formed, and then forming an opening in the layer to expose a part of the surface of the diffused region of the semiconductor body. An epitaxial layer of silicon is deposited on top. Single crystal silicon will grow over the exposed silicon area and if a diffused region is present in the substrate a pedestal will outdiffuse through the same area from the buried diffused region. Polycrystalline silicon will grow on top of the dielectric material. The pedestal is formed in a single crystal epitaxial layer of another impurity type. Two other active elements of a bipolar transistor, such as the emitter and intrinsic base regions, are then formed in the same single crystal epitaxial layer while the inactive area, such as the extrinsic base, is formed in polycrystalline silicon. A reach-through is made through the dielectric layer to the third element of the transistor, that is collector region.

Reference is made to U.S. Pat. No. 3,873,383 entitled "Integrated Circuits With Oxidation-Junction Isolation and Channel Stop" granted Mar. 25, 1975 to E. Kooi. The Kooi patent discloses a method of making a semiconductor device in a major surface of a semiconductor body having an inset pattern of insulating material and in which an additional doped zone is provided adjacent to the inset pattern. Prior to the provision of the inset pattern providing an oxidation and impurity masking layer pattern with apertures at the areas where the inset pattern is to be formed, doping the body through the apertures and thereafter oxidizing the body portions through the apertures, thereby providing oxidation-junction isolation and channel stop.

Reference is made to U.S. Pat. No. 3,886,000 entitled "Method for Controlling Dielectric Isolation of a Semiconductor Device" granted May 27, 1975 to R. L. Bratter et al. The Bratter et al patent discloses a dielectric isolation barrier formed in a silicon substrate by oxidizing openings formed in an epitaxial layer on the substrate and a layer of silicon oxynitride ($SiO_xN_y$) which is on the surface of the epitaxial layer of the substrate. During this oxidation of the openings, the layer of silicon oxynitride is thermally oxidized to form an electrically insulating layer of silicon dioxide on the surface of the epitaxial layer and homogenous with the silicon dioxide of the dielectric isolation barrier. The index of refraction of the layer of silicon oxynitride is selected in accordance with its thickness to produce a desired thickness of the layer of silicon dioxide after completion of oxidation of the openings in which the dielectric isolation barrier is formed. The index of refraction of silicon oxynitride is preferably between 1.55 and 1.70.

Reference is made to U.S. Pat. No. 3,894,893 entitled "Method for the Production of Monocrystal-Polycrystal Semiconductor Devices" granted July 15, 1975 to Y. Kabaya et al. The Kabaya et al patent discloses a method for the production of a semiconductor device, said device being composed of a plurality of polycrystalline regions and monocrystalline regions epitaxially grown on a substrate so that, between each of the two kinds of regions at least one monocrystalline to polycrystal junction is formed, whereby the conventional diffusion-type isolating process which is difficult in practice can be completely eliminated.

Reference is made to U.S. Pat. No. 3,900,350 entitled "Method of Manufacturing Semiconductor Devices in which Silicon Dioxide Regions Inset in Silicon are Formed By Masking Oxidation, wherein an Intermediate Layer of Polycrystalline Silicon is Provided Between the Substrate and the Oxidation Mask" granted Aug. 19, 1975 to J. A. Appels et al.

Reference is made to U.S. Pat. No. 3,935,328 entitled "Method for Providing Dielectric Isolation in an Epitaxial Layer of a Compound Semiconductor Using Plasma Oxidation", granted Jan. 27, 1976 to T. Sugano et al.

Reference is made to U.S. Pat. No. 3,998,673 entitled "Method for Forming Electrically-Isolated Regions in Integrated Circuits Utilizing Selective Epitaxial Growth" granted Dec. 21, 1976 to P. Chow. The Chow patent discloses a process for forming electrically-isolated regions in integrated circuits in the form of dielectric moats surrounding the regions and P-N junctions underlying the regions. Moats or notches are etched into the substrate prior to the formation of the buried isolation layer or further device information. A dielectric material such as silicon dioxide is deposited in the notches or moats and polycrystalline silicon is thereafter grown on the surface of the wafer to fill the notches or moats. The excess polysilicon formed on the surface of the wafer is then removed by mechanical lapping or polishing. Since there has been no doping or epitaxial growth, the wafer may be lapped directly to the substrate to remove all the polysilicon and oxide from the surface while leaving the notches or moats lined with dielectric material and filled with polysilicon.

Reference is made to U.S. Pat. No. 4,001,465 entitled "Process for Producing Semiconductor Devices" granted Jan. 4, 1977 to J. Graul et al. The Graul et al patent discloses a ring or lattice-shaped groove or trench etched into a surface of a Si monocrystal layer. At least one boundary of the so-etched groove or trench is coated with a strip-shaped layer of an oxidation-blocking material, such as $Si_3N_4$ and the area of the substrate adjacent to the $Si_3N_4$ layer and/or the substrate area enclosed by such layer is provided with a relatively thick $SiO_2$ layer which extends deeper into the Si surface than does the $SiN_4$ layer, while the Si surface within the groove or trench remains uncoated. The so-obtained arrangement is then thermally oxidized under conditions sufficient to at least partially fill the groove or trench with $SiO_2$. Thereafter, the oxidation-blocking layer and at least a part of the SiO$_2$ layer which is outside the ring or lattice-shaped trench is removed by a suitable etchant from the monocrystalline surface and the thus uncovered Si surface is further processed to produce small pn-junctions.

SUMMARY OF THE INVENTION

The primary object of the invention is to provide an improved planar deep oxide isolation process.

A further object of the invention is to provide an improved semiconductor structure containing planar deep oxide isolation.

A still further object of the invention is to provide an improved planar deep oxide isolation process wherein resin glass is utilized as an e-beam resist and as the oxide isolation in deep trenches.

A yet further object of the invention is to provide a planar deep oxide isolation process for forming deep oxide isolation independent of trench size.

The term "resin glass" is defined as follows:

A polymer consisting of alternating atoms of silicon and oxygen with organic groups attached to the silicon atoms. The types of groups and amount of organic substitution determine whether the resin is a liquid or a solid and also determines the nature of the cured resin. Heat treatment enables a film of this polymer to be converted to silica by eliminating the organic residues.

The term "resin glass" is defined in U.S. Pat. No. 3,985,597 entitled "Process for Forming Passivated Metal Interconnection System with a Planar Surface" granted Oct. 12, 1976 to Laura B. Zielinski, and U.S. Pat. No. 4,004,044 entitled "Method for Forming Patterned Films utilizing A Transparent Lift-Off Mask" granted Jan. 18, 1977 to J. R. Franco et al.

The use of polysiloxanes as electron-beam resists has been described in the literature: E. D. Roberts, "The Preparation and Properties of A Polysiloxane Electron Resist", J. Electrochem. Soc. Vol. 120, No. 12, Dec. 1973.

A sizeable number of resin glasses are commercially available. For example, Dow-Corning 805, Owens-Illinois 650, Dow-Corning 649, General Electric SR 125 and General Electric SR 124.

The invention may be summarized as follows:

A planar deep oxide isolation process for providing deep wide silicon dioxide filled trenches in the planar surface of a silicon semiconductor substrate, said process comprising the steps:

a. form deep wide trenches in the planar surface of the silicon substrate;
b. form a thin layer of silicon dioxide on the planar surface of the silicon substrate and the exposed silicon surfaces of said deep wide trenches;
c. apply resin glass (polysiloxane) to the planar surface of said semiconductor substrate and within said deep wide trenches;
d. spin off at least a portion of the resin glass on the planar surface of the substrate;
e. low temperature bake the substrate;
f. e-beam expose the resin glass contained within the deep wide trenches of substrate;
g. develop resin glass contained on said substrate in solvent;
h. heat substrate in oxygen to convert said resin glass contained within said deep wide trenches to silicon dioxide;
i. deposit a layer of silicon dioxide to provide a planar silicon dioxide surface on exposed surface of substrate; and
j. planarize exposed silicon dioxide surface to silicon of substrate.

A planar deep oxide isolation process for providing deep wide silicon dioxide filled trenches in the planar surface of a silicon semiconductor substrate as recited in the preceding paragraph, wherein the following steps are performed in lieu of step i, said steps comprising:
(i-1) apply a second thin layer of resin glass by spin coating;
(i-2) convert said resin glass to silicon dioxide.

A planar deep oxide isolation process for providing deep wide silicon dioxide filled trenches in the planar surface of a silicon semiconductor substrate as recited in either of the two preceding paragraphs, wherein the following step is performed subsequent to step b and prior to step c, said step comprising:
(b-1) form a thin layer of silicon nitride on the thin layer of silicon dioxide formed in step b.

DESCRIPTION OF THE PREFERRED EMBODIMENTS

In chip design for very small devices in VLSI areas of deep trench isolation of various dimensions are required. The depth of these deep trenches is $\approx 4$ μm while the width varies from 2 μm to 50 μm. The larger trenches present a particular problem, since the CVD oxide used to fill the trenches does not planarize over these larger dimensions ($\geq 8$ μm).

Known approaches to this problem require either enormous film thicknesses or extremely difficult lithography. The film thicknesses of the former approaches ($\sim 8$ μm) leads to significant non-uniformities and consequently over etching at the Si surface.

The following process, in accordance with the invention, provides for a planar deep oxide isolation by filling the larger trenches before the final oxide.

Figure 1:
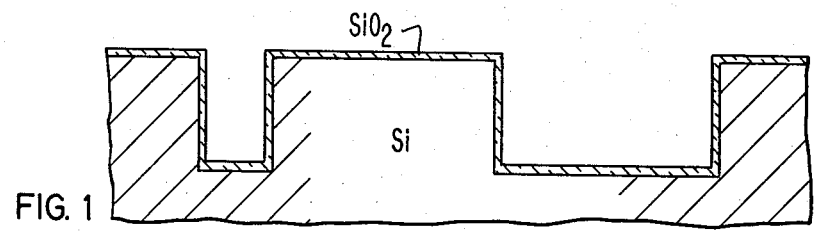
FIGS. 1 through 5 are respectively simplified cross-sectional views of a portion of a semiconductor structure at successive stages of the planar deep oxide isolation process in accordance with the invention.

The process steps:

1. Form desired geometrics of deep trenches in Si by reactive ion etching, as shown in FIG. 1. The reactive ion etching can be done in a chlorine containing plasma such as Ar/Cl$_2$ mixtures or Ar/Cl$_4$ mixtures. A fluorinated gas can also be used such as CF$_4$. Other techniques for defining the deep trenches in Si are sputter etching in an inert gas such as Argon or ion milling.

2. Oxidize wafers forming a thin layer (2000Å) of thermal SiO$_2$ over Si.

3. Deposit a thin layer (300Å) of pyro Si$_3$N$_4$ (optional—as sodium barrier).

4. Apply resin glass (polysiloxane) to wafer and spin off. The solids content of the solution and spin speed can be varied in order to achieve the film thickness desired. The film should be slightly thicker than the depth of the trench to be filled. See FIG. 2. The thickness of resin glass necessary depends on the silicon-oxygen content of the polysiloxane. Higher silicon-oxygen content results in less thickness loss during conversion to silica and therefore a thinner resin glass film can be coated initially.

5. Low temperature bake (80° C.) on hotplate to remove solvent.

Figure 2:
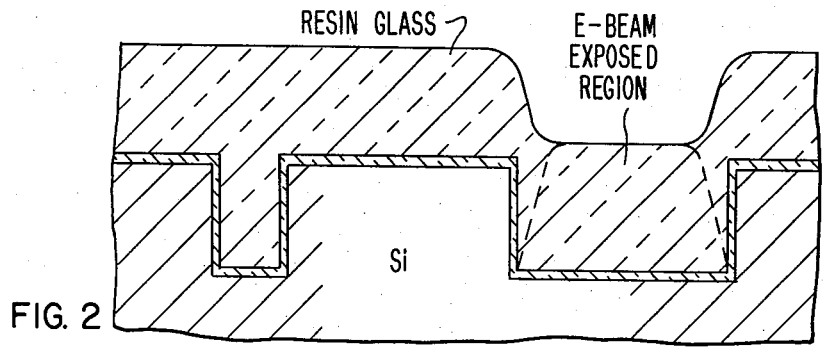

6. E-beam expose. The resin glass is a negative e-beam resist. Expose the wide trenches only as shown in FIG. 2. A dose of 20 $\mu$coul/cm$^2$ or more is necessary, at 25 keV acceleration of the e-beam.

Figure 3:
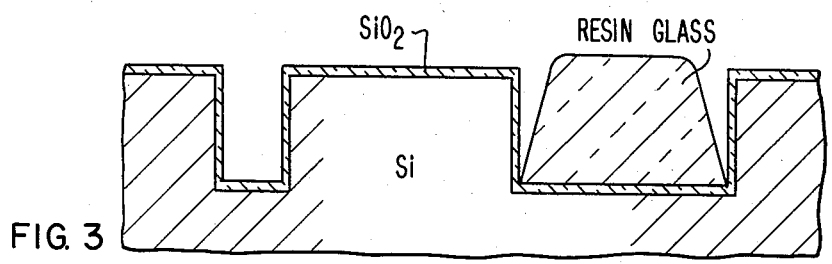

7. Develop, in acetone or similar solvent depending on resin glass used. See FIG. 3.

8. Convert the resin glass to SiO$_2$ by heating in furnace at approximately 600° C. in O$_2$ atmosphere. See FIG. 4.

9a. Apply a second thin layer of resin glass ($\sim$2 $\mu$m) . . . convert to SiO$_2$. or 9b. Deposit a thin layer of pyro SiO$_2$ ($\sim$2$\mu$m).

Figure 4:
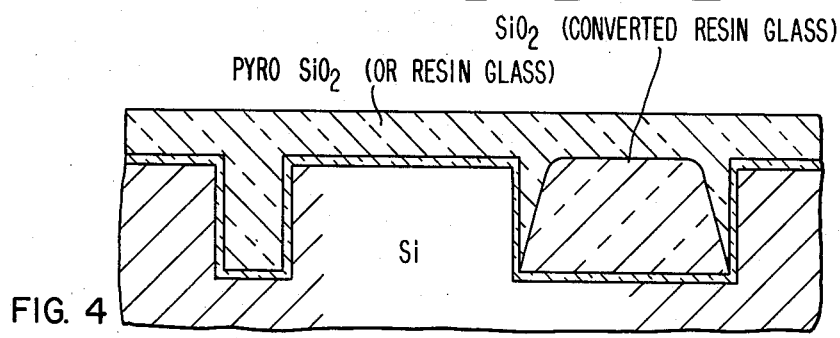

The surface should be planar SiO$_2$ at this stage as shown in FIG. 4.

Figure 5:
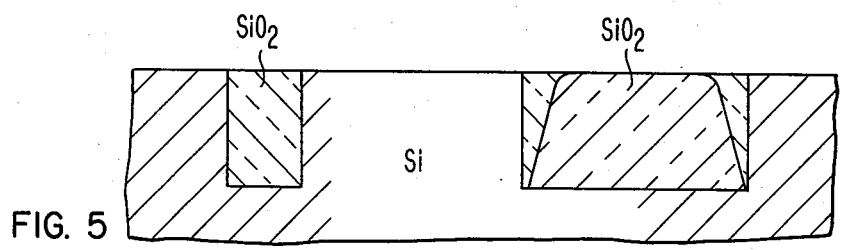

10. Etchback to Si surface in CF$_4$ or H$_2$—CF$_4$ plasma resulting in a planar oxide isolation, as shown in FIG. 5.

The inventive process is unique in that it combines the use of resin glass as an e-beam resist and as the oxide isolation for deep trenches. The process provides a planar surface independent of trench width since the wide trenches are separately filled.

RESIN GLASS FOR DEEP TRENCH ISOLATION

We have evaluated five commercially available polysiloxanes for use in this deep trench isolation process. The most applicable material is the Dow-Corning 805; however, all of the materials do function in this process. The major differences between the materials is their E-beam sensitivity and subsequent thickness loss during develop. Described below are processes for each of the materials. All of the polysiloxanes were filtered prior to use. Silver filters of 1.0 $\mu$m pore size were used in a Millipore pressurized filtering apparatus. All of the materials as received from the vendors contained a great deal of particulates and gels which had to be removed in order to obtain good quality films.

In all of the processes described below we assume the trenches have been defined in the Si wafer. There are a number of processes for the etching of Si trenches such as reactive ion etching, sputter etching or ion milling techniques. After the trenches are etched, thin layers of thermal oxide and silicon nitride are deposited. The purpose of the silicon nitride is to provide a barrier for ionic contamination. The thermal oxide is necessary to provide adhesion of the silicon nitride film to the Si wafer and to electrically passivate the silicon surface.

We are assuming a trench depth of 4.0 $\mu$m. For shallower trenches, thinner layers of glass resin would be used. This can be accomplished by increasing spin speeds or diluting the polysiloxane prior to coating the wafer.

I DOW-CORNING 805

1. Apply HMDS (hexamethydisilazane) to wafer. After a 30 second dwell time spin at 2000 rpm for 30 seconds. The HMDS acts as an adhesion promoter.
2. Apply Dow-Corning 805 polysiloxane; flood wafer completely. After dwell time of 30 seconds, spin wafer at 2000 rpm for 3000 seconds.
3. Bake wafer on hotplate at 100° C. for 45 minutes.
4. E-beam expose at 20 $\mu$coul/cm$^2$.
5. Develop — 20 seconds in acetone followed by water-/acetone quench (1:1 H$_2$O/acetone).
6. Bake on hotplate at 200° C. for 15 minutes.
7. Final conversion to SiO$_2$ is done in a tube furnace at 600° C. in O$_2$ atmosphere for 60 minutes.

A few comments on the above process. The initial bake time in step 3 can be varied from 30 to 60 minutes at 100° C. and a good clean develop can still be obtained. Baking initially for 90 minutes at 100° C. will result in the inability to develop the resin. Also baking at or above 120° C. will make the resin impossible to develop in acetone but a long develop cycle of 10 minutes can be obtained in NMP when the resin is in this stage.

Higher E-beam exposures cause slightly less thickness loss after develop, however, the 20 $\mu$coul/cm$^2$ exposure is sufficient.

The following solvents were investigated as possible developers: xylene, toluene, n-butyl acetate (NBA), isopropanol, methanol, acetone, n-methyl pyrrolidinone (NMP).

With xylene, toluene and NBA developing of the pattern occurred after a 20 $\mu$coul/cm$^2$ E-beam exposure. However, the pattern obtained was not as cleanly defined as with the use of acetone as the developer.

8. Planarizing step can be done with either (a) more resin glass or (b) CVD SiO$_2$.
   8(a) Apply diluted solution DC 805 (5:1 DC805: xylene) and after 30 seconds dwell time spin at 4000 rpm for 30 seconds. Bake on hotplate at 100° C. for 15 minutes. Bake on hotplate at 200° C. for 15 minutes. Bake in furnace (O$_2$) at 600° C. for 60 minutes. Reactive ion etch (RIE) in a diode system, at 13.56 MHz, 0.25 watts/cm$^2$, 20 millitorr CF$_4$.
   8(b) Deposit 2.0 $\mu$m CVD-SiO$_2$ RIE etchback — same as above.

II GENERAL ELECTRIC SR124

1. Apply HMDS to wafer. After a 30 second dwell time, spin at 2000 rpm for 30 seconds.
2. Apply GE-SR124 polysiloxane to wafer. After 30 second dwell time, spin at 2000 rpm for 30 sec.
3. Bake on hotplate at 100° C. for 45 minutes.
4. E-beam expose — 20 $\mu$coul/cm$^2$.
5. Develop in acetone for 15 seconds followed by water/acetone (1:1) quench and N$_2$ blow dry.
6. Bake on hotplate at 200° C. for 15 minutes.
7. Final conversion to SiO$_2$ is done in tube furnace at 600° C. in an O$_2$ atmosphere for 60 minutes.
8. (same as shown for DC805).

The initial bake time in step 3 is not critical between 30–90 minutes. The initial bake temperature can also go up to 125° C. without affecting the developing of the resin. However, loss of development will occur for material baked at 125° C. for 120 minutes. Also, exceeding 200° C. will result in inability to develop a pattern.

III GENERAL ELECTRIC SR125

Process steps for SR124 and 125 are identical. The differences are the solids content and solvent system of the polysiloxane which results in slightly different film thicknesses. (After a 200° C. bake the SR124 is 5.8 $\mu$m thick while the SR125 is 4.8 $\mu$m thick). One other difference is the critical temperature and time which the materials can withstand and still be developable. The SR125 cannot be developed if the initial bake is longer than 45 minutes at 100° C.

IV OWENS-ILLINOIS 605

This material is received in a solid form and must be put into solution. It is soluble in a number of solvents.

We used a 50% solution in N-butyl acetate for the following process:
1. Apply HMDS to wafer. After 30 second dwell time, spin at 2000 rpm for 30 seconds.
2. Apply 50% solution of OI-650. After 30 second dwell time, spin at 2000 rpm for 30 seconds.
3. Bake on hotplate for 10 minutes at 80° C.
4. E-beam expose - $20\mu$ coul/cm$^2$.
5. Develop in acetone for 20 seconds followed by a water/acetone quench and N$_2$ blow dry.
6. Bake at 200° C. for 15 minutes on hotplate.
7. Final conversion at 600° C. in O$_2$ atmosphere (tube furnace) for 60 minutes.
8. (same as before).

The Owens-Illinois 650 resin is very sensitive to initial bake. If it is baked for 30 minutes at 80° C. the resin will not develop properly after E-beam exposure. Also, baking at 100° C. will result in the resin not developing. Because the resin film is in a very unstable state prior to E-beam expose due to the low temperature bake we have observed a number of shelf life or aging effects. The results obtained with this material have been the most difficult to reproduce. As the films age their develop time increases also showing a strong dependence upon the environment in which the aging is done.

V DOW-CORNING 649

The material is received in solution. The process is identical to that for the O-I 650 material except that it can withstand slightly longer bake times at 80° C. Initial bakes up to 45 minutes at 80° C. will result in good development of the pattern. Also, the best solvent for developing this material is NMP for about 30 seconds followed by a water rinse and dry.

We have described processes for the five commerically available polysiloxanes which we investigated. There are many more polysiloxanes available. The invention should not be limited to the materials we have used. Also, the solvents used for developing the resin have not been fully investigated. Better developers can also be found. Basically, we have reduced the invention to practice using materials (both polysiloxanes and solvents) which were easily available and easy to handle.

While the invention has been particularly shown and described with reference to the preferred embodiments thereof, it will be understood by those skilled in the art that various changes in form and details may be made therein without departing from the spirit and scope of the invention.

Having thus described our invention, what we claim as new, and desire to secure by Letters Patent is:

1. A planar deep oxide isolation process for providing deep wide silicon dioxide filled trenches in the planar surface of a silicon semiconductor substrate, said process comprising the following steps:
   (a) form deep wide trenches in the planar surface of the silicon substrate;
   (b) form a thin layer of silicon dioxide on the planar surface of the silicon substrate and the exposed silicon surfaces of said deep wide trenches;
   (c) apply resin glass to the planar surface of said semiconductor substrate and within said deep wide trenches;
   (d) spin off at least a portion of the resin glass on the planar surface of the substrate;
   (e) low temperature bake the substrate;
   (f) e-beam expose the resin glass contained within the deep wide trenches of the substrate;
   (g) develop resin glass contained on substrate in a solvent;
   (h) heat substrate in oxygen to convert resin glass contained within said deep wide trenches to silicon dioxide;
   (i) deposit a layer of silicon dioxide to provide a planar silicon dioxide surface on the exposed surface of said substrate; and
   (j) planarize said exposed silicon dioxide surface to said silicon of said substrate.

2. A planar deep oxide isolation process for providing deep wide silicon dioxide filled trenches in the planar surface of a silicon semiconductor substrate as recited in claim 1, wherein the following steps are performed in lieu of step i of claim 1, said steps comprising:
   (i-1) apply a second thin layer of resin glass; and
   (i-2) convert said resin glass to silicon dioxide.

3. A planar deep oxide isolation process for providing deep wide silicon dioxide filled trenches in the planar surface of a silicon semiconductor substrate as recited in either claim 1 or claim 2, wherein the following step is performed subsequent to step b and prior to step c, said step comprising:
   (b-1) form a thin layer of silicon nitride on the thin layer of silicon dioxide formed in step b.

4. A planar isolation process for providing silicon dioxide in deep wide trenches in a planar surface of a monolithic silicon semiconductor substrate, as recited in claim 1 or claim 2, said process being further characterized in that the trenches are in the order of 2 to 50 micrometers wide and in the order of 4 micrometers deep.

5. A planar isolation process, as claimed in claim 1 or claim 2, said process being further characterized in that said resin glass is any one of the following materials Dow-Corning 805, General Electric SR124, General Electric SR125, Owens-Illinois 650, or Dow-Corning 649.

6. A planar isolation process for providing silicon dioxide in deep wide trenches in a planar surface of a monolithic silicon semiconductor substrate, as recited in claim 3, said process being further characterized in that the trenches are in the order of 2 to 50 microns wide and in the order of 4 microns deep.

7. A planar isolation process, as recited in claim 3, said process being further characterized in that said resin glass is any one of the following materials, Dow-Corning 805, General Electric SR124, General Electric SR125, Owens-Illinois 650, or Dow-Corning 649.

* * * * *